(12) United States Patent
Matocha et al.

(10) Patent No.: US 7,829,402 B2
(45) Date of Patent: Nov. 9, 2010

(54) MOSFET DEVICES AND METHODS OF MAKING

(75) Inventors: Kevin Sean Matocha, Rexford, NY (US); Stephen Daley Arthur, Glenville, NY (US); Ramakrishna Rao, Bangalore (IN); Peter Almern Losee, Rensselaer, NY (US); Zachary Matthew Stum, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/368,498

(22) Filed: Feb. 10, 2009

(65) Prior Publication Data

US 2010/0200931 A1 Aug. 12, 2010

(51) Int. Cl.
*H01L 21/336* (2006.01)
*H01L 21/8234* (2006.01)

(52) U.S. Cl. .................. 438/197; 438/510; 438/514; 257/E21.17; 257/E21.051; 257/E21.058; 257/E21.227; 257/E21.247; 257/E21.248; 257/E21.421

(58) Field of Classification Search .................. 438/197, 438/506, 508, 510, 514, 287, 289, 680; 257/288, 257/E21.17, 51, 58, 227, 247, 248, 421, 322
See application file for complete search history.

(56) References Cited

U.S. PATENT DOCUMENTS

| | | | |
|---|---|---|---|
| 6,054,352 A | 4/2000 | Ueno | |
| 6,107,142 A | 8/2000 | Suvorov et al. | |
| 6,238,980 B1 | 5/2001 | Ueno | |
| 6,429,041 B1 | 8/2002 | Ryu et al. | |
| 6,639,273 B1 | 10/2003 | Ueno | |
| 6,956,238 B2 * | 10/2005 | Ryu et al. | 257/77 |
| 7,074,643 B2 | 7/2006 | Ryu | |
| 7,221,010 B2 | 5/2007 | Ryu | |
| 7,285,465 B2 * | 10/2007 | Tarui et al. | 438/268 |
| 7,381,992 B2 | 6/2008 | Ryu | |
| 2006/0192256 A1 | 8/2006 | Cooper et al. | |
| 2007/0126007 A1 | 6/2007 | Matocha | |

FOREIGN PATENT DOCUMENTS

| | | |
|---|---|---|
| EP | 1775774 A1 | 4/2007 |
| WO | WO03100864 A3 | 12/2003 |

OTHER PUBLICATIONS

Asmita Saha and James A. Cooper; A 1-kV 4H-SiC Power DMOSFET Optimized for Low ON-Resistance; IEEE Transactions on Electron Devices; Oct. 2007; pp. 2786-2791; vol. 54, No. 10.

* cited by examiner

*Primary Examiner*—David Nhu
(74) *Attorney, Agent, or Firm*—Scott J. Asmus

(57) ABSTRACT

A MOSFET device and a method for fabricating MOSFET devices are disclosed. The method includes providing a semiconductor device structure including a semiconductor device layer of a first conductivity type, and ion implanting a well structure of a second conductivity type in the semiconductor device layer, where the ion implanting includes providing a dopant concentration profile in a single mask implant sequence.

33 Claims, 9 Drawing Sheets

MOSFET DEVICES AND METHODS OF MAKING

BACKGROUND

The invention relates generally to semiconductor devices and methods of making, more particularly, the invention relates to MOSFET devices and methods of making.

Some of the parameters affecting MOSFET device performance, reliability, and repeatability, include but not limited to, threshold voltage, blocking voltage and specific-on resistance. Various device regions including but not limited to, the well structure and the channel region, play a significant role in the behavior of these parameters. Currently known processing techniques, for example, implantation of well structures with epitaxially-regrown channels, cause wide variability in threshold voltage.

Therefore, there is a need for more robust processing techniques, which will enable improved control of key device parameters and thereby enable devices with better device performance and greater reliability and repeatability.

BRIEF DESCRIPTION

One embodiment disclosed herein is a method for fabricating a MOSFET device. The method includes providing a semiconductor device structure comprising a semiconductor device layer of a first conductivity type, and ion implanting a well structure of a second conductivity type in the semiconductor device layer, wherein said ion implanting comprises providing a dopant concentration profile in a single mask implant sequence, wherein a net charge density within a depth $W_B$ from an implantation surface of the semiconductor device layer, is in a range from about $1.4 \times 10^{12}$ cm$^{-2}$ to about $2.3 \times 10^{12}$ cm$^{-2}$, wherein $W_B$ is in a range from about 0.15 μm to about 0.2 μm.

In another embodiment disclosed herein is a method for fabricating a MOSFET device. The method includes providing a semiconductor device structure comprising a semiconductor device layer of a first conductivity type, and ion implanting a well structure of a second conductivity type in the semiconductor device layer, wherein said ion implanting comprises providing a dopant concentration profile in a single mask implant sequence, wherein Δ, an average rate of change in dopant concentration with well depth, in a region from a well depth of $W_B$ to a depth of $2W_B$, is given by $$\Delta = \frac{1}{W_B^2} \int_{W_B}^{2W_B} (N_A - N_D)(x)\,dx < X,$$

wherein X=6 decades/μm, wherein $2W_B$ is in a range from about 0.3 μm to about 0.4 μm.

In yet another embodiment disclosed herein is a MOSFET device. The MOSFET device includes a well structure including a channel region formed in a semiconductor device layer, wherein a net charge density within a depth $W_B$ from a surface of the semiconductor device layer, is in a range from about $1.4 \times 10^{12}$ cm$^{-2}$ to about $2.3 \times 10^{12}$ cm$^{-2}$, wherein $W_B$ is in a range from about 0.15 μm to about 0.2 μm, wherein a channel length of the channel region is in a range from about 0.2 μm to about 1 μm and wherein a net charge density of the channel region is greater than about two times the net charge density in a JFET region of the MOSFET device.

DRAWINGS

These and other features, aspects, and advantages of the present invention will become better understood when the following detailed description is read with reference to the accompanying drawings in which like characters represent like parts throughout the drawings, wherein.

FIGS. 3-7 schematically represent the cross-sectional side views of the fabrication stages of a MOSFET in accordance with one embodiment of the present invention.

Figure 8:
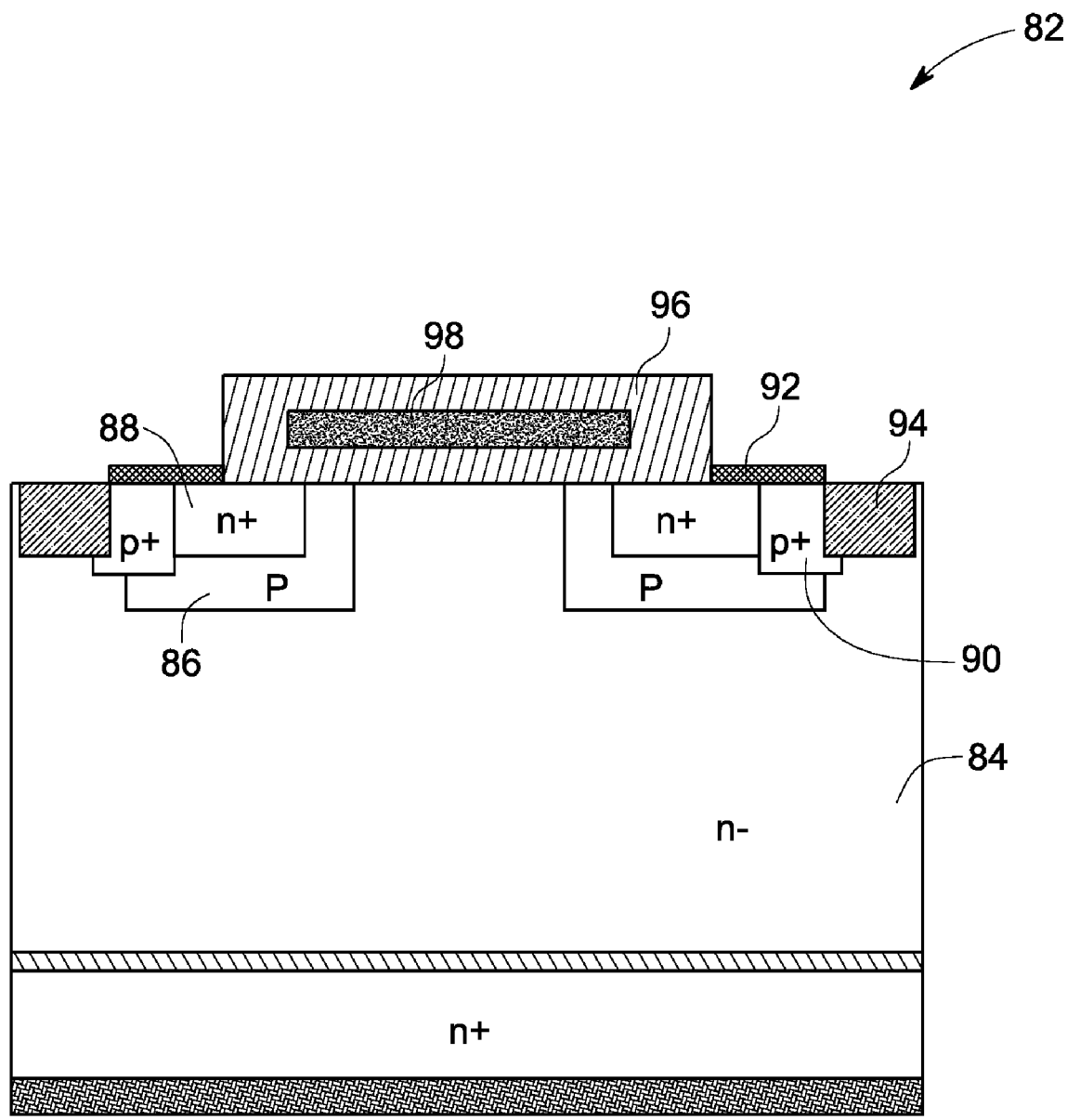

FIG. 8 is a cross-sectional side view of a MOSFET in accordance with another embodiment of the present invention.

Figure 9:
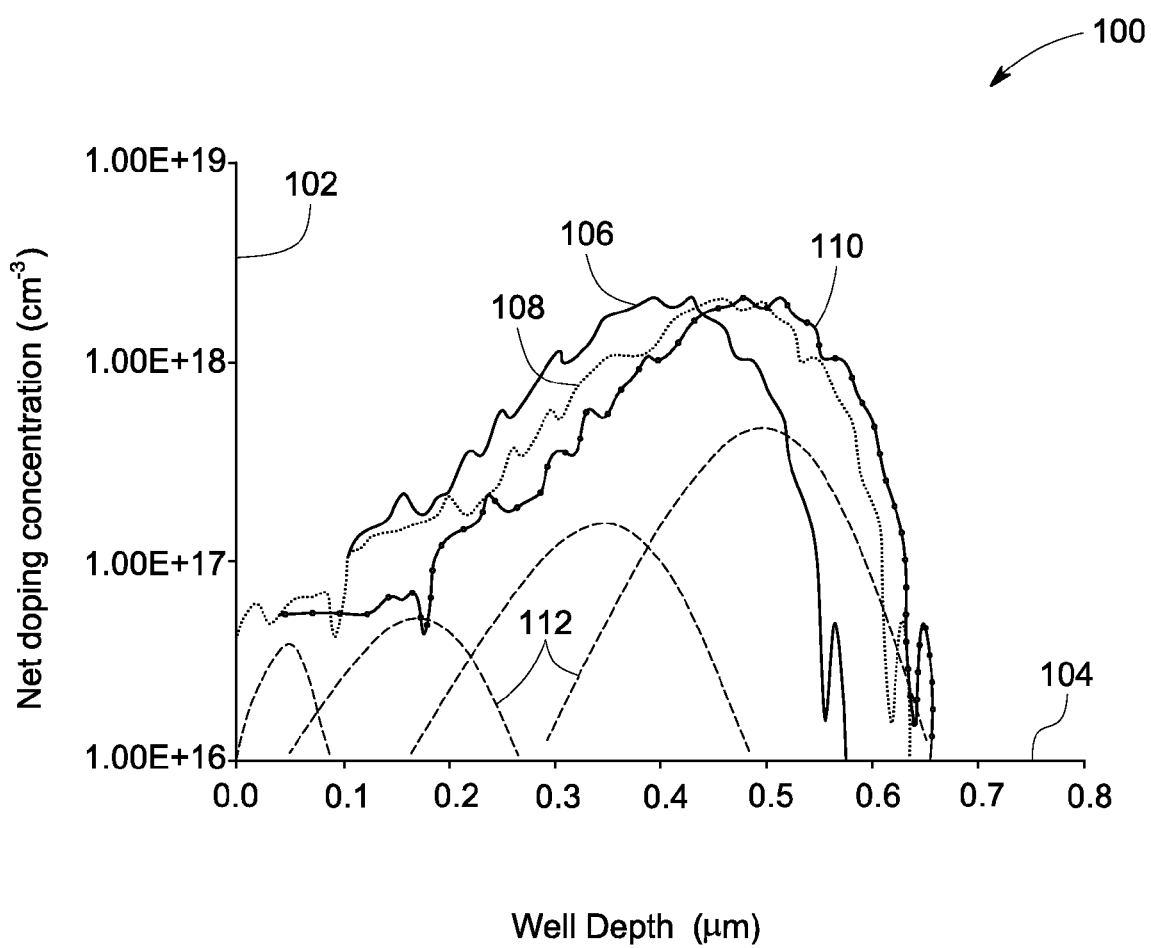

FIG. 9 is a graphical representation of dopant concentration versus well depth in a MOSFET device in accordance with one embodiment of the present invention.

Figure 10:
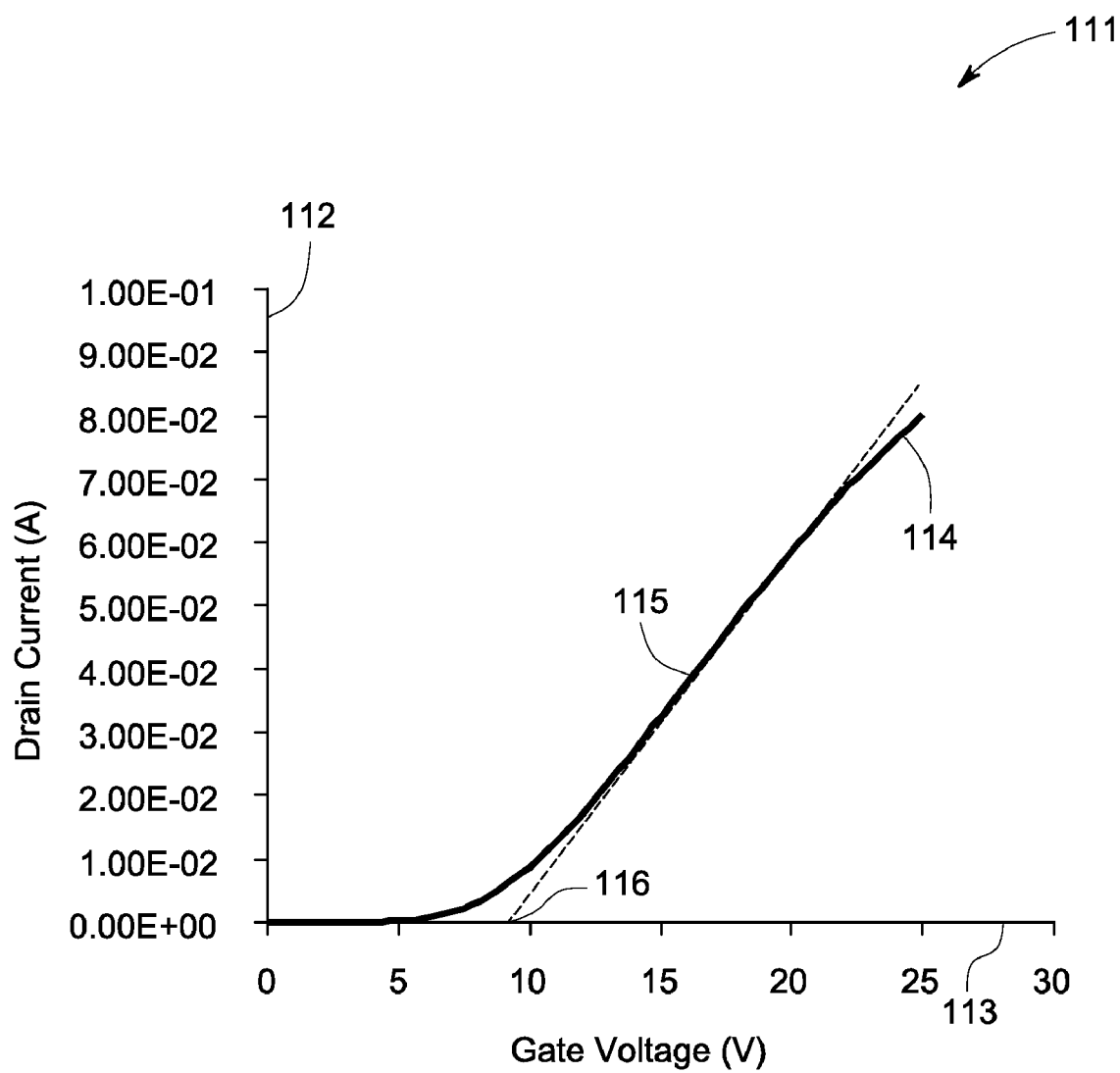

FIG. 10 is a graphical representation of variation of drain current with gate voltage in a MOSFET device, in accordance with one embodiment of the present invention.

Figure 11:
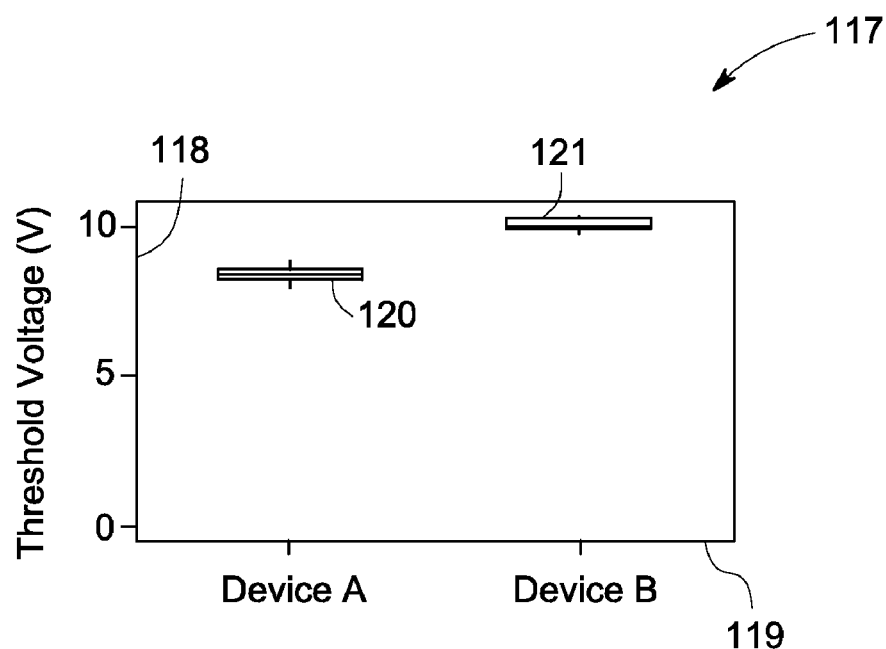

FIG. 11 is a graphical representation of measured threshold voltage in MOSFET devices, in accordance with one embodiment of the present invention.

Figure 12:
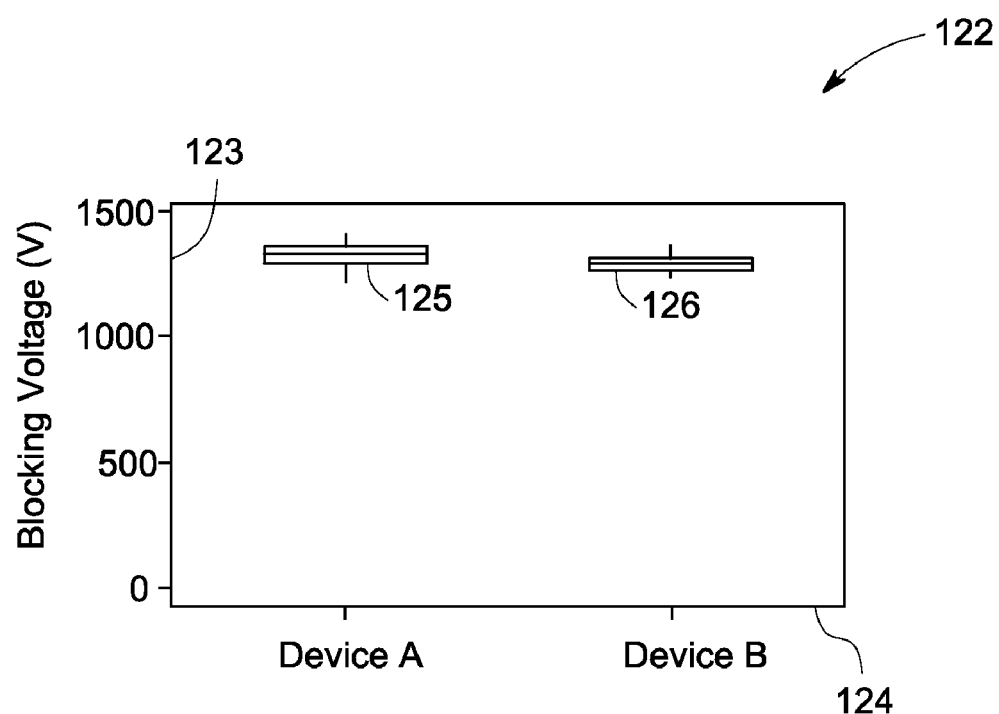

FIG. 12 is a graphical representation of measured blocking voltage in MOSFET devices, in accordance with one embodiment of the present invention.

Figure 13:
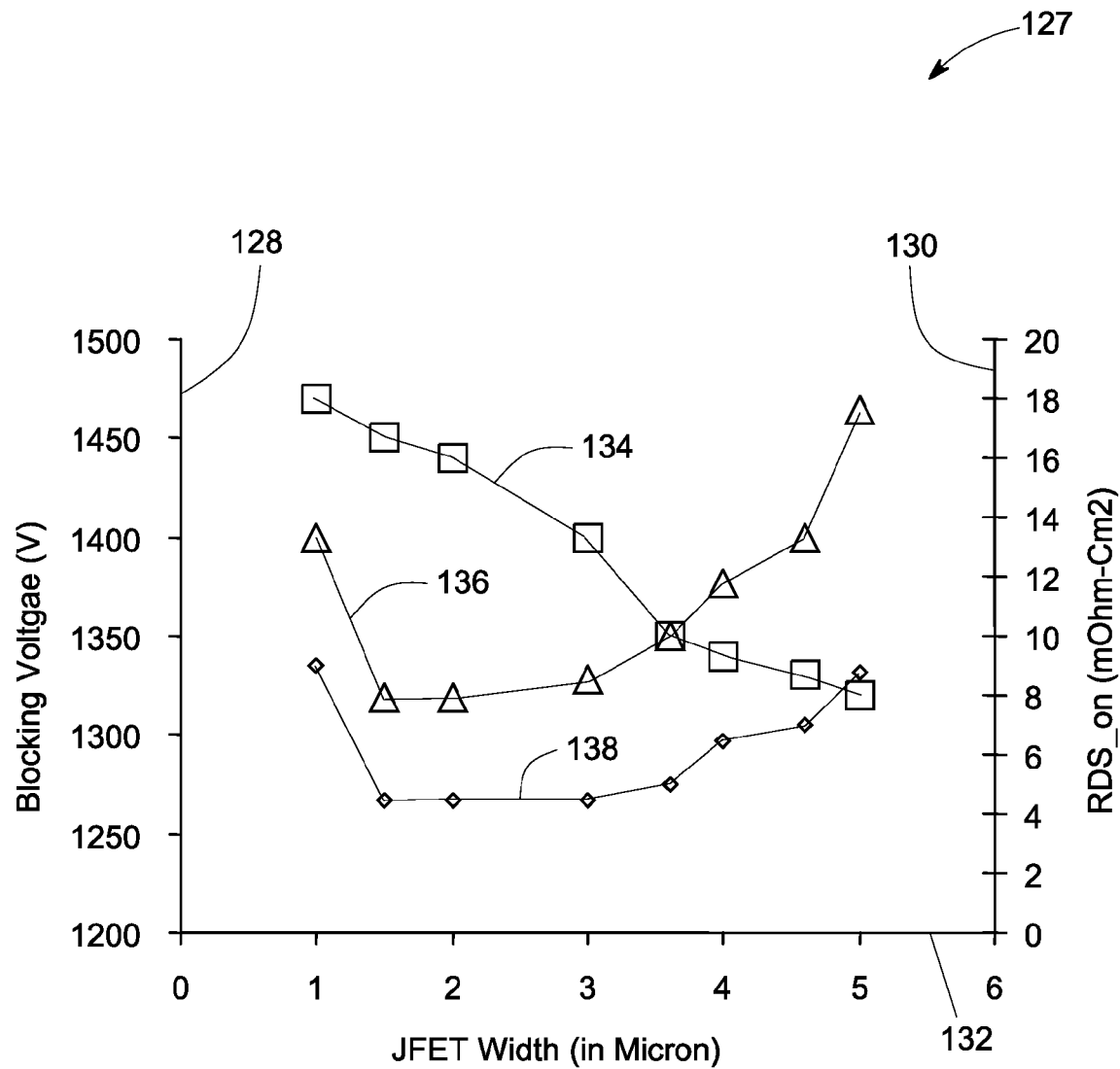

FIG. 13 is a graphical representation of calculated variation of blocking voltage and on-resistance with JFET width, in accordance with one embodiment of the present invention.

DETAILED DESCRIPTION

Embodiments of the present invention include methods of fabricating MOSFET devices. In the following specification and the claims that follow, the singular forms "a", "an" and "the" include plural referents unless the context clearly dictates otherwise. As used herein, the terms "disposed over" or "deposited over" refer to disposed or deposited immediately on top of and in contact with, or disposed or deposited on top of but with intervening layers therebetween.

One embodiment of the present invention is a method for fabricating a MOSFET device. The method includes ion implanting a well structure in a semiconductor device layer of a first conductivity type. This ion implanting results in a well structure of a second conductivity type. The well structure is provided with a desired dopant concentration profile in a single mask implant sequence. The term, "single mask implant sequence," as used herein and through out the rest of the specification and the claims, refers to the use of a single mask to provide the dopant concentration profile of the well structure and the channel region. The single mask implant sequence may include one or more implantation process sub-steps, wherein implantation is carried out at one or a plurality of ion implantation energies, but always using the same single mask.

As used herein, the term "implantation surface" refers to the surface of a semiconductor device layer through which ion implantation occurs into the bulk of the layer, or alternatively, in embodiments incorporating screening layers prior to implantation, the implantation surface may refer to the screening layer surface through which ion implantation occurs into the bulk of the semiconductor device layer.

As used herein, the term "JFET region" refers to the region between two well structures in the semiconductor device layer of a MOSFET device. The width of the JFET region is defined by the spacing between the two well structures and the depth of the JFET region is defined by the total depth of the well structure.

As used herein, the term "channel region" refers to the region defined by the channel length and the channel depth (corresponding to the depletion width).

As used herein, the term "threshold voltage" refers to the voltage given by the X-intercept of the linear fit to the drain current versus gate voltage characteristics of a MOSFET device.

As used herein, the term "net charge density" in a region refers to the integrated net dopant concentration over a depth W. In the context of the net charge density in a region of the well structure, the net charge density is net dopant concentration ($N_A$ (the well region dopant concentration of the second conductivity type) minus-$N_D$ (the background semiconductor device layer concentration of first conductivity type)) integrated over a depth W. Total charge density of a region refers to the net dopant concentration integrated over the total depth.

Figure 1:
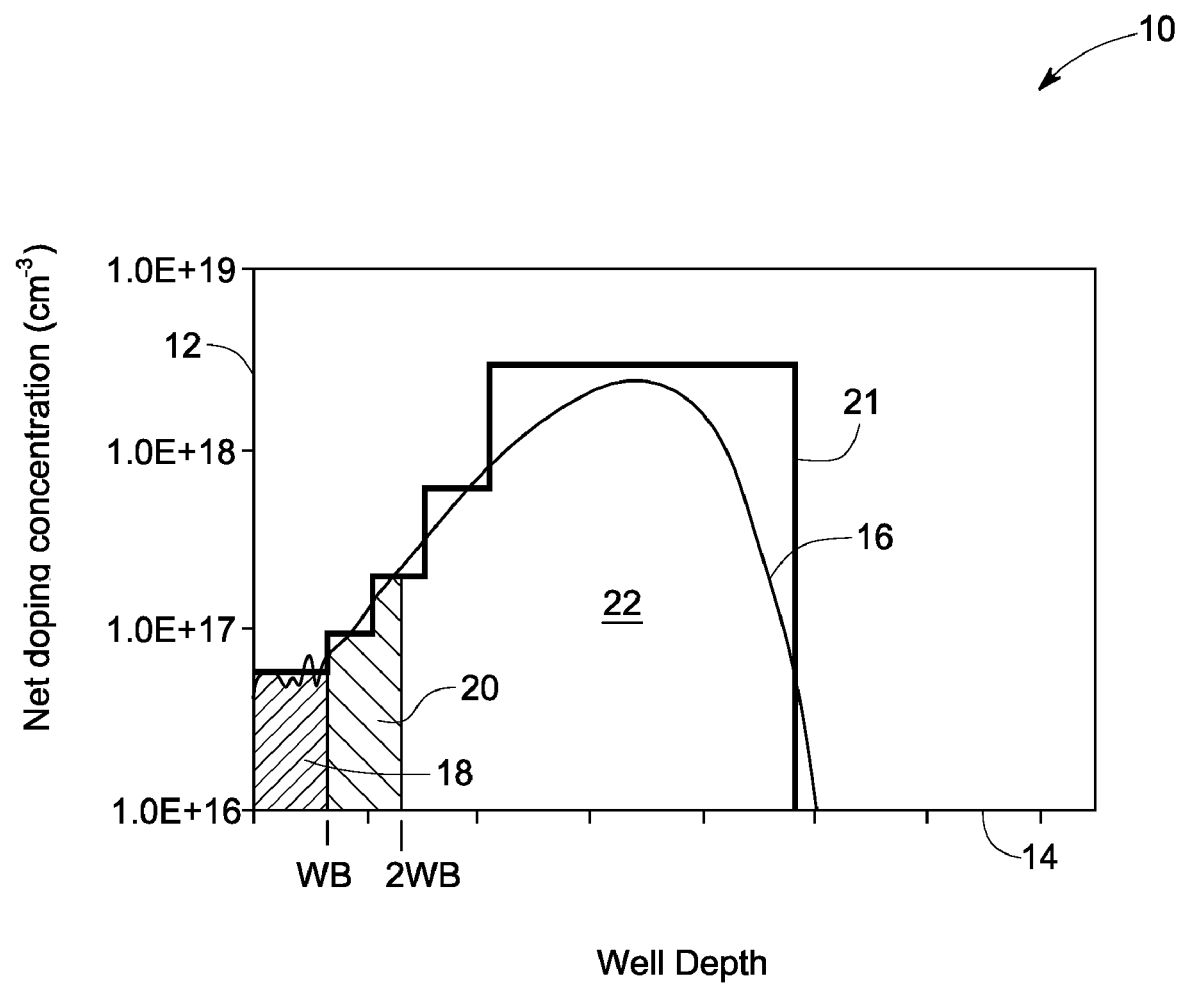
FIG. 1 is a graphical representation of variation in dopant concentration with depth in a well structure of a MOSFET device in accordance with embodiments of the present invention.

FIG. 1 is a graphical illustration 10 of the variation in dopant concentration (Y-axis 12) with well depth (X-axis 14) in a MOSFET well structure, in accordance with one embodiment of the present invention. In an exemplary embodiment, the dopant concentration profile is given by line plot 16. The dopant profile includes regions 18 (region from the implantation surface to a well depth of $W_B$) and 20 (region from a well depth of $W_B$ to a well depth of $2W_B$) having net charge densities $Q_1$ and $Q_2$ respectively. In the example of line plot 16, the dopant concentration profile is illustrated to be a gradually varying profile. In other embodiments, the dopant concentration profile may have step-like structures in the profile, as illustrated by line plot 21 in FIG. 1.

In one embodiment, post the single mask implant sequence, a net charge density $Q_1$ present within a depth $W_B$ of from about 0.2 µm to 0.15 µm, is in a range from about $1.4 \times 10^{12}$ cm$^{-2}$ to about $2.3 \times 10^{12}$ cm$^{-2}$. Although the Applicants do not wish to be bound by any particular theory, the Applicants believe that the region 18 in the well structure corresponding to the well region within depth $W_B$ and having a net charge density $Q_1$, provides control over the threshold voltage. In a non-limiting example, the region 18 has a substantially uniform dopant concentration, wherein the variation in the dopant concentration in this region is less than 20% of the dopant concentration in this region.

In a further non-limiting embodiment, the net charge density $Q_1$ within a depth $W_B$ of 0.2 µm contributes, during the MOSFET operation, to a threshold voltage associated with strong inversion of the well structure at the surface of the semiconductor device layer to be in a range from about 3 volts to about 10 volts.

In one embodiment, Δ, an average rate of change in dopant concentration with well depth, in a region from a well depth of $W_B$ to a depth of $2W_B$ (region 20) of the well structure, is given by $$\Delta = \frac{1}{W_B^2} \int_{W_B}^{2W_B} (N_A - N_D)(x)\, dx < X,$$

wherein X=6 decades/µm and wherein $2W_B$ is in a range from about 0.3 to about 0.4 µm. In the illustrated example of line plot 16 in FIG. 2, in one embodiment, the average rate of change in dopant concentration in the region corresponding to net charge density $Q_2$ is less than 6 decades/µm.

Although the applicants do not wish to be bound by any particular theory, the Applicants believe that the net charge density in the region of the dopant concentration profile between a depth $W_B$ and $2W_B$ (region 20) and the rate of the change of dopant concentration may play a role in inhibiting premature breakdown due to punch through effects and favor an avalanche breakdown mode. In one example, the net charge density in this region 20 is greater than about $1 \times 10^{13}$ cm$^{-2}$. In one embodiment, the total charge density in the dopant concentration profile region 22, including the regions 18 and 20 corresponding to the entire well structure in the well structure, is in a range from about $2 \times 10^{13}$ cm$^{-2}$ to about $2 \times 10^{14}$ cm$^{-2}$.

In one example, the dopant concentration profile is a modified variant of a retrograde profile, having a region of substantially constant dopant concentration as described above, corresponding to a region within depth $W_B$, followed by a rising dopant concentration region. In a further example, the dopant concentration along the depth of the well after a rise in the concentration reaches a peak concentration. In a still further example, the dopant concentration decreases beyond the peak concentration as illustrated by line plot 16. In a non-limiting example, the average rate of dopant concentration decrease from a peak concentration is greater than the average rate of increase to the peak concentration. In a further non-limiting example, the peak concentration is reached at a depth greater than half the depth of the well region.

In some embodiments, the single mask implant sequence includes ion implanting at a plurality of ion implant energies. For example, the implant energies may be selected to be in a range from about 5 keV to about 700 keV. In one embodiment, the single mask implant sequence includes implanting ions of a single conductivity type. In an alternate embodiment, single mask implant sequence includes ion implanting both p-type and n-type conductivity.

Figure 2:
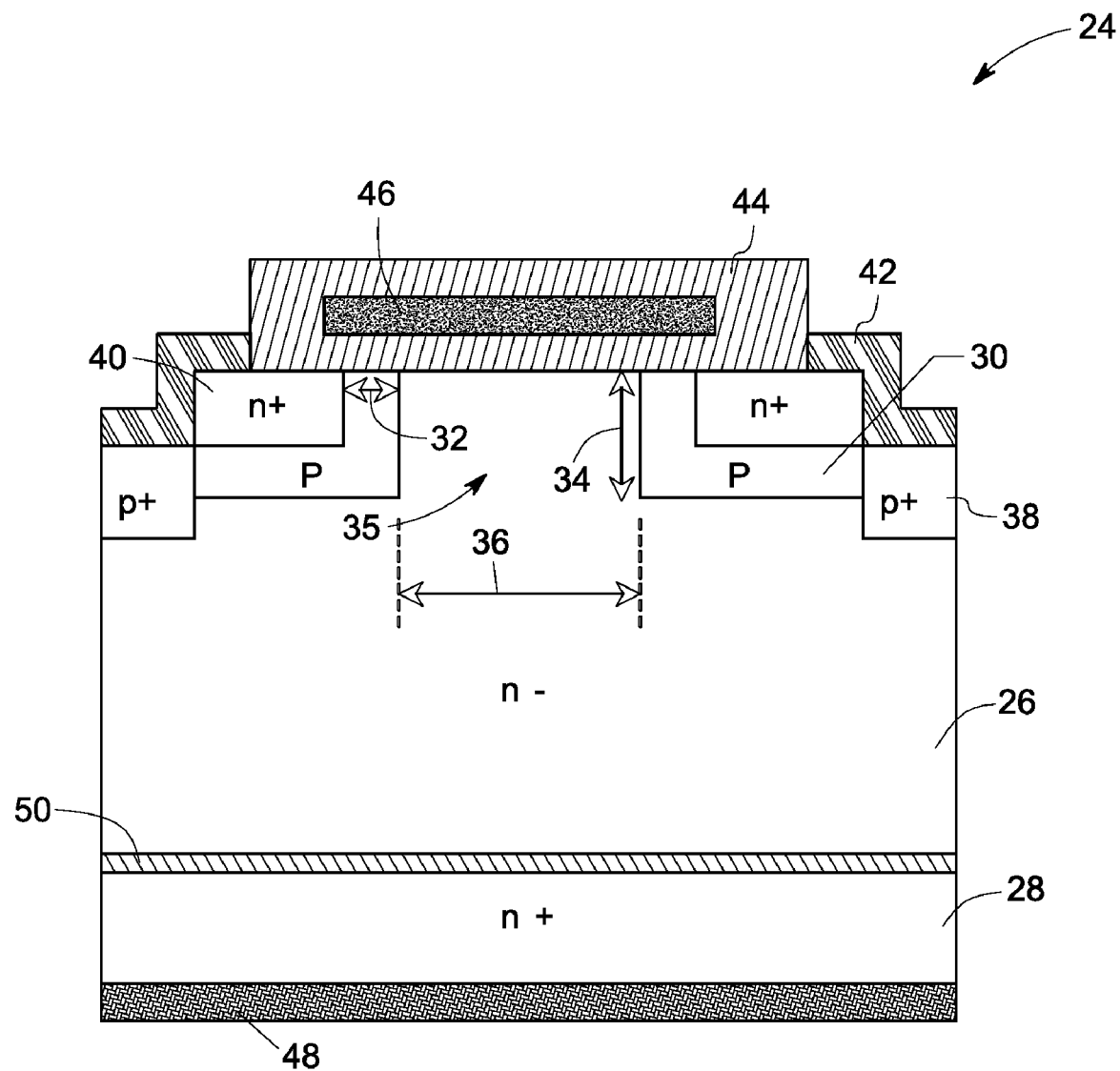
FIG. 2 is a cross-sectional side view illustration of a MOSFET in accordance with one embodiment of the present invention.
Figure 3:
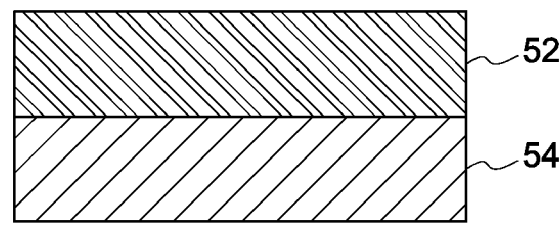

Illustrated in FIG. 2 is a MOSFET device 24 in accordance with one embodiment of the present invention. The device includes a n-type conductivity semiconductor device layer 26, disposed over an n-type substrate layer 28. In one example, at least a part of the device layer 26 forms the drift region in the device. The device further includes a p-type conductivity well structure 30 having a depth 34 and including a channel region of length 32. The channel region formed in the well structure is substantially defined by the region from an edge of a source region 40 through to an edge of the well structure, along the surface of the semiconductor device layer corresponding to the channel length and the channel depth corresponding to the depletion width. In a non-limiting example, the channel length is in a range from about 0.2 µm to about 1 µm.

As illustrated, it can be further noted that the region between the two well structures 30 forms a JFET region 35 with a JFET width 36. The device 24 further includes a dimpled, highly doped p-type well contact region 38, a highly doped n-type source region 40 and a source contact region 42, gate dielectric 44, gate electrode 46 and drain 48. In one embodiment, the gate electric layer thickness is in a range from about 30 to about 100 nm. In some embodiments a buffer layer 50 may be found disposed between the substrate 28 and the device layer 26.

One of the regions of the semiconductor device, which also affects the device functionality, is the JFET region defined by the JFET width 36 as illustrated in FIG. 2. In one embodiment, a net charge density in the channel region is greater than about two times the net charge density in a JFET region.

In certain embodiments, the net charge in a region of the well structure to a depth of $2W_B$ from the surface of the semiconductor device layer is greater than three times the net charge density in the JFET region. In one example, $W_B$ corresponds to 0.2 μm. In a non-limiting example, the width of the JFET region is in a range from about 1 μm to about 5 μm.

FIGS. 3-7 schematically represent a process for fabricating a MOSFET in accordance with one embodiment of the present invention. In one embodiment, the MOSFET is a vertical MOSFET. The method step illustrated in FIG. 3 includes providing a semiconductor device layer 52 over a substrate 54. In the illustrated embodiment, the device layer 52 includes a drift region of the MOSFET. The device layer 52 may be epitaxially grown over the substrate 54. For example, a deposition technique such as, chemical vapor deposition (CVD) may be performed to form the device layer 52. The substrate and the device layer may be n-type or p-type. For example, the semiconductor device layer may be a SiC device layer of any polytype of silicon carbide, such as 4H SiC, or 6H SiC polytypes. In certain embodiments, the thickness of the semiconductor device layer 52 may be in a range of about 1 micron to about 150 microns.

In a non-limiting example, the MOSFET is a silicon carbide MOSFET, and the semiconductor device layer is a silicon carbide layer. In another example, the MOSFET is a gallium nitride MOSFET, wherein the semiconductor device layer is a gallium nitride layer.

Although in the representative embodiments of FIGS. 2-8, the first conductivity type is n-type and second conductivity type is p-type, embodiments with p-type first conductivity and n-type second conductivity, also fall within the scope of this invention.

In a non-limiting example, the substrate is a heavily doped n+ SiC substrate and the SiC semiconductor device layer is also of n-type. The dopant concentration in the substrate may be in a range from about $10^{18}$ cm$^{-3}$ to about $10^{21}$ cm$^{-3}$. The dopant concentration in the SiC semiconductor device layer may be in a range from about $10^{14}$ cm$^{-3}$ to about $10^{17}$ cm$^{-3}$.

Figure 4:
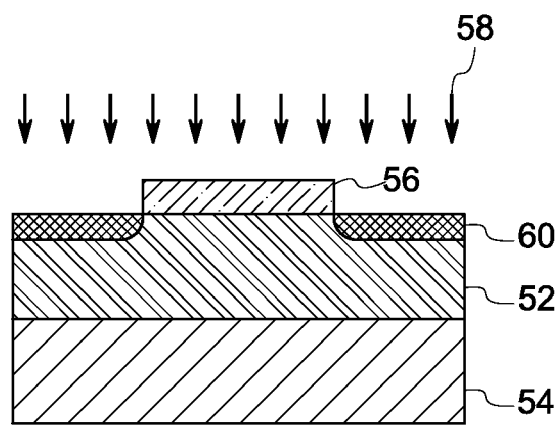

The method further includes forming an implant mask layer 56. Ion implantation 58 is performed to form one or more well structures 60 as illustrated in FIG. 4. The energy at which the ions are implanted to form the well structure may be in a range from about 5 keV to about 700 keV. In one example, the well structure is a p-well structure. In certain embodiments a dopant concentration in the well structure is in a range from about $1\times10^{16}$ cm$^{-3}$ to about $1\times10^{18}$ cm$^{-3}$. In some embodiments, a well structure depth is in a range from 0.4 microns to 2 microns. The implantation of the well structure in this example is conducted through a single mask implant sequence.

Figure 5:
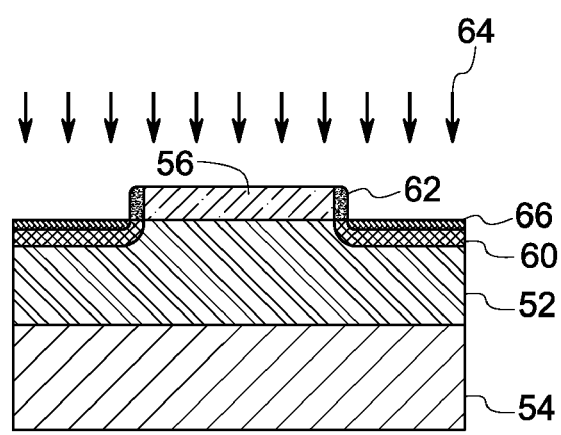

In the step illustrated in FIG. 5, implant mask spacers 62 are formed adjacent to implant mask layer 56 and ion implantation 64 is performed to form the source region 66. In one example, forming a source region includes forming a source region implant mask spacer to mask a portion corresponding to a channel length and ion implanting the source region. In one embodiment, the width of the implant mask spacer is selected to be in a range from 0.2 microns to 2 microns and can in some embodiments correspond substantially to the desired channel length. In one example, if the well structure is p-doped, the source region is an n-doped region. In some embodiments, the energy at which the ions are implanted to form the source is in a range from about 5 keV to about 2 MeV.

In certain embodiments, the source region has a dopant concentration in a range from about $1\times10^{16}$ cm$^{-3}$ to $1\times10^{18}$ cm$^{-3}$.

Figure 6:
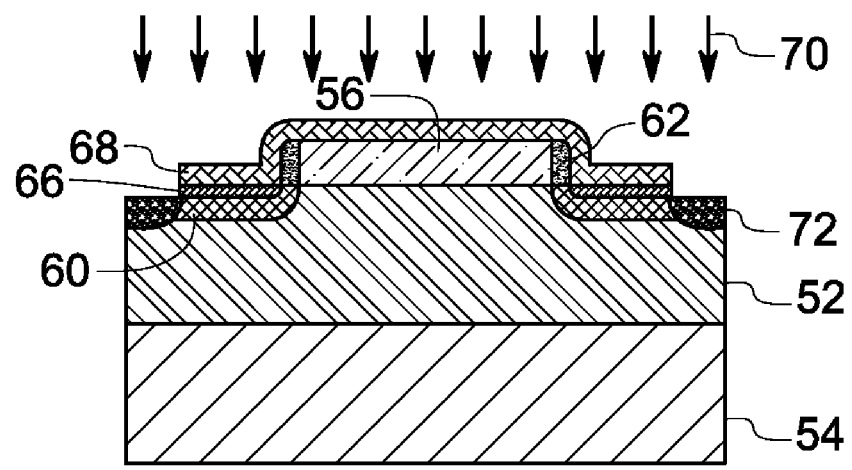
Figure 7:
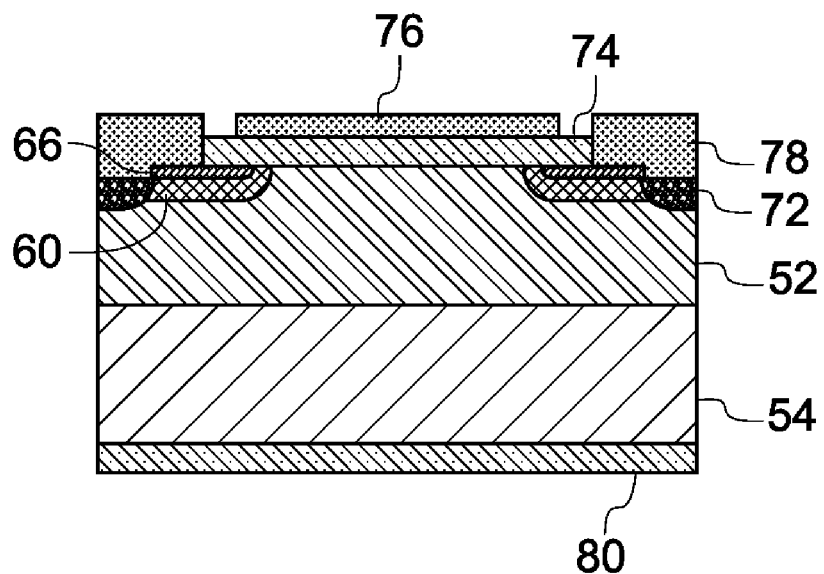

FIG. 6 illustrates the process of ion implantation to form a high dopant concentration well contact region. This step includes the formation of a well contact region mask layer 68 and subsequently ion implanting 70 to form a highly doped well contact region 72. In one embodiment, the well contact region has a dopant concentration in a range from about $1\times10^{18}$ cm$^{-3}$ to about $1\times10^{21}$ cm$^{-3}$, higher than the dopant concentration in the well structure. In the illustrated example of FIG. 6, the well contact region 72 is a dimpled region and is formed deeper than the well structure 60. In alternate embodiments, the well contact region may not be a dimpled region. In some embodiments, the energy at which the ions are implanted to form the contact region is in a range from about 5 keV to about 300 keV. In some embodiments, the contact region depth is in a range from about 0.5 microns to about 10 microns. In certain embodiments, the contact region depth is in a range from about 1 micron to about 5 microns.

Following implantation, the various masking layers or spacers are, in one example, removed. After any or a sequence of implantation steps, the implanted ions may be subjected to annealing. In one example, the annealing is carried out at temperatures greater than 1500° C. In a further example, the annealing is carried out at temperatures in the range from 1400° C. to 1800° C. In one embodiment, exposure to high temperature helps, for example, in the electrical activation of ion-implanted species.

The well structure mask layer, the source region implant mask spacers, and the contact region mask layer discussed herein may include materials with sufficient ion stopping power required to mask the implanted ions and which can be selectively removed from the semiconductor surface without surface damage. Suitable examples include silicon nitride, silicon oxide, photoresist, amorphous carbon, sapphire, and aluminum nitride.

As will be appreciated, a MOSFET having a p-doped layer or region with p-type dopants may be doped with dopants such as but not limited to boron, aluminum, gallium, magnesium, carbon, calcium, or any combinations thereof. A MOSFET having an n-doped layer or region with n-type dopants may be doped with dopants such as but not limited to nitrogen, phosphorus, arsenic, antimony, or any combinations thereof.

In some embodiments, prior to ion implantation, a screening layer (not shown) may be at least partially disposed over the semiconductor device layer to protect the device layer surface during implantation. Suitable materials for the screening layer include but are not limited to carbon, silicon dioxide, silicon nitride, photoresist, sapphire, and aluminum nitride. The formation of the screening layer may be through thermal oxidation in some embodiments while, in certain other embodiments, deposition techniques such as CVD may be employed to form the screening layer. The screening layer may be disposed uniformly over a patterned masking layer and the exposed portion at a desirable thickness. In some embodiments, the thickness of the screening layer may be in a range from about 50 Å to about 1000 Å.

The method may further include the step of forming a gate dielectric layer 74 (shown in FIG. 7) over the semiconductor device layer, subsequent to the annealing of the implanted ions and the removal of all masking layers and masking spacers. The formation of a gate dielectric layer 74, for example in silicon carbide devices, may be through thermal oxidation of the SiC followed by annealing at a high temperature. In another example, a low temperature chemical vapor deposition (CVD) technique may be used to form a thin oxide layer. The gate dielectric may include materials such as but not limited to silicon oxide and silicon nitride. The method may further include the steps of forming gate electrode 76 and source contacts 78. The illustrated MOSFET device shown in FIG. 13 further includes a drain contact 80. In certain embodiments, the gate dielectric thickness is in a range from about 30 nm to about 100 nm.

FIG. 8 is a MOSFET device 82 in accordance with another embodiment of the present invention. The device includes a n-type conductivity semiconductor device layer 84, a p-type conductivity well structure 86 and a source region 88 and a source contact 92. In contrast to the embodiment described in FIG. 2, the device includes a highly doped p-type well contact region 90, which is not dimpled. The MOSFET device may further include a junction termination extension 94, as illustrated in FIG. 8 to help terminate high voltage semiconductor junctions. The junction termination extension 94 is of the same conductivity type as the well structure and the well contact region and is formed in contact with the well-contact region. The device further includes a gate dielectric 96 and a gate electrode 98.

In some embodiments in accordance with the present invention, the MOSFET device exhibits a blocking voltage in a range from about 600 to about 10000 volts. In a further embodiment, the MOSFET device exhibits a blocking voltage in a range from about 600 to about 2000 volts.

In certain embodiments, the MOSFET device exhibits a specific on-resistance in a range from about 1 mOhm cm$^2$ to about 200 mOhm cm$^2$. In a further embodiment, the specific on-resistance is in a range from about 5 mOhm cm$^2$ to about 20 mOhm cm$^2$.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLE 1

FIG. 9 is a graphical representation 100 of calculated dopant concentration (Y-axis 102) versus well depth (X-axis 104), in accordance with one embodiment of the present invention. Line plots 106, 108 and 110 are representative examples of desired dopant concentration profiles in accordance with one embodiment of the present invention. In a non-limiting example, the dopant concentration profile 108 is achieved through ion implantation using a plurality of implantation sub-steps with a plurality of energies in a single mask implant sequence. The dopant concentration profile 108, in one example, is the dopant concentration profile of the plurality of implantation profiles 112 at a plurality of energies.

EXAMPLE 2

FIG. 10 shows a line plot 111 illustrating the process for determining the threshold voltage of a MOSFET device, in accordance with one embodiment of the present invention. The line curve 114 illustrates the drain current (Y-axis 112) versus gate voltage (X-axis 113) characteristics. A linear fit 115 to the line curve 114, intercepts the gate voltage axis (X-axis) at a voltage 116, which is taken to be the threshold voltage. In the illustrated example, the linear fit to the line curve 114, is derived by a straight line passing through the 20% and 80% levels of the maximum drain current.

EXAMPLE 3

To study the threshold and blocking voltage characteristics of MOSFET devices in embodiments of the present invention, two MOSFET devices, device A and device B, were manufactured with channel lengths of about 0.7 μm and dopant concentrations of about $5.3 \times 10^{13}/cm^3$ and about $8 \times 10^{13}/cm^3$ respectively.

FIG. 11 is a plot 117 of measured threshold voltage (Y-axis) 118 for devices A and B (X-axis 119), in accordance with one embodiment of the present invention. Device A exhibits a threshold voltage (120) in the region of about 8 volts and device B exhibits a threshold voltage (121) in the region of about 10 volts.

The blocking voltage for devices A and B were also measured. FIG. 12 is a plot 122 of measured blocking voltage (Y-axis) 123 for devices A and B (X-axis 124), in accordance with one embodiment of the present invention. Device A exhibits a blocking voltage (125) in the region of about 1300 volts and device B exhibits a blocking voltage (126) in the region of about 1250 volts. Therefore, these devices exhibit threshold and blocking voltages in the desired ranges.

FIG. 13 is a graphical representation 127 of calculated variation of blocking voltage ($Y_1$-axis 128 measured in volts) and on-resistance ($Y_2$-axis 130 measured in mohms-cm$^2$) with JFET width (X-axis 132 measured in microns) in accordance with one embodiment of the present invention. Plot 134 shows the variation of blocking voltage with JFET Width for a channel length of 0.7 microns and indicates that a blocking voltage in a range from about 1500 volts to about 1300 volts is obtained with JFET widths in a range from about of 1 to about 5 microns. Line plot 136 shows the variation in the measured on-resistance with JFET width for a gate voltage $V_G$ of 10 volts. The calculated on-resistance varies in a range from about 9 to 18 mohms-cm$^2$. Line plot 138 shows the variation in the measured on-resistance with JFET width for a gate voltage $V_G$ of 15 volts. The calculated on-resistance varies in a range from about 5 to 10 mohms-cm$^5$.

While only certain features of the invention have been illustrated and described herein, many modifications and changes will occur to those skilled in the art. It is, therefore, to be understood that the appended claims are intended to cover all such modifications and changes as fall within the true spirit of the invention.

The invetion claimed is:

1. A method for fabricating a MOSFET device comprising:
providing a semiconductor device structure comprising a semiconductor device layer of a first conductivity type; and
ion implanting a well structure of a second conductivity type in the semiconductor device layer, wherein said ion implanting comprises providing a dopant concentration profile in a single mask implant sequence, wherein a net charge density within a depth $W_B$ from an implantation surface of the semiconductor device layer, is in a range from about $1.4 \times 10^{12}/cm^2$ to about $2.3 \times 10^{12}/cm^2$, wherein $W_B$ is in a range from about 0.15 μm to about 0.2 μm.

2. The method for fabricating a MOSFET device according to claim 1, wherein a threshold voltage associated with strong inversion of the well structure at the surface of the semiconductor device layer is in a range from about 3 volts to about 10 volts.

3. The method for fabricating a MOSFET device according to claim 1, wherein the single mask implant sequence comprises implanting at a plurality of implant energies.

4. The method for fabricating a MOSFET device according to claim 3, wherein ion implanting the well structure comprises ion implanting with a plurality of implant energies in a range from about 5 keV to about 700 keV.

5. The method for fabricating a MOSFET device according to claim 1, wherein the total charge density in the well structure is in a range from about $2\times10^{13} cm^{-2}$ to about $2\times10^{14} cm^{-2}$.

6. The method for fabricating a MOSFET device according to claim 1, wherein $\Delta$ an average rate of change of dopant concentration with well depth, in a region from a well depth of $W_B$ to a depth of $2W_B$, is given by $$\Delta = \frac{1}{W_B^2} \int_{W_B}^{2W_B} (N_A - N_D)(x) dx < X,$$

wherein X=6 decades /μm.

7. The method for fabricating a MOSFET device according to claim 1, further comprising forming a source region of the first conductivity type in the ion implanted well structure.

8. The method for fabricating a MOSFET device according to claim 7, wherein a channel region has a channel length in a range from about 0.2 μm to about 1 μm.

9. The method for fabricating a MOSFET device according to claim 8, wherein a net charge density of the channel region is greater than about two times the net charge density in a JFET region of the MOSFET device.

10. The method for fabricating a MOSFET device according to claim 8, wherein the net charge density in a region of the well structure to a depth of $2W_B$ from the surface of the semiconductor device layer is greater than three times the total charge density in the JFET region.

11. The method for fabricating a MOSFET device according to claim 8, wherein a width of the JFET region is in a range from about 1 μm to 5 μm.

12. The method for fabricating a MOSFET device according to claim 7, wherein forming the source region comprises forming a source region implant mask spacer to mask a portion corresponding to a channel length and ion implanting the source region.

13. The method for fabricating a MOSFET device according to claim 1, further comprising forming a well-contact region of the second conductivity type.

14. The method for fabricating a MOSFET device according to claim 13, wherein the well-contact region is a dimpled well-contact region.

15. The method for fabricating a MOSFET device according to claim 1, further comprising forming a junction termination extension of the second conductivity type in contact with the well-contact region.

16. The method for fabricating a MOSFET device according to claim 1, further comprising disposing a gate dielectric layer over the semiconductor device layer.

17. The method for fabricating a MOSFET device according to claim 16, wherein the gate dielectric thickness is in a range from about 30nm to about 100nm.

18. The method for fabricating a MOSFET device according to claim 1, wherein the first conductivity type is n-type and second conductivity type is p-type.

19. The method for fabricating a MOSFET device according to claim 1, wherein the MOSFET device has a blocking voltage in a range from about 600 to about 10000 volts.

20. The method for fabricating a MOSFET device according to claim 19, wherein the blocking voltage in a range from about 600 to about 2000 volts.

21. The method for fabricating a MOSFET device according to claim 1, wherein the MOSFET device has a threshold voltage in a range from about 3 volts to 7 volts and wherein the device has a specific on-resistance in a range from about 1 mOhm cm² to about 200 mOhm cm².

22. A method for fabricating a MOSFET device comprising:

providing a semiconductor device structure comprising a semiconductor device layer of a first conductivity type; and ion implanting a well structure of a second conductivity type in the semiconductor device layer, wherein said ion implanting comprises providing a dopant concentration profile in a single mask implant sequence, wherein $\Delta$ an average rate of change in dopant concentration with well depth, in a region from a well depth of $W_B$ to a depth of $2W_B$, is given by $$\Delta = \frac{1}{W_B^2} \int_{W_B}^{2W_B} (N_A - N_D)(x) dx < X,$$

wherein X=6 decades /μm, wherein $2W_B$ is in a range from about 0.3 μm to about 0.4 μm.

23. The method for fabricating a MOSFET device according to claim 22, wherein a threshold voltage associated with strong inversion of the well structure at the surface of the semiconductor device layer is in a range from about 3 volts to about 10 volts.

24. The method for fabricating a MOSFET device according to claim 22, wherein a net charge density of the channel region is greater than about two times a net charge density in a JFET region.

25. The method for fabricating a MOSFET device according to claim 22, wherein the net charge density in a region of the well structure to a depth of $2W_B$ from the surface of the semiconductor device layer is greater than three times the total charge density in the JFET region.

26. A MOSFET device comprising a well structure including a channel region formed in a semiconductor device layer, wherein a net charge density within a depth $W_B$ from a surface of the semiconductor device layer, is in a range from about $1.4 \times 10^{12}$ /cm² to about $2.3 \times 10^{12}$/cm², wherein $W_B$ is in a range from about 0.15 μm to about 0.2 μm, wherein a channel length of the channel region is in a range from about 0.2 μm to about 1 μm and wherein a net charge density of the channel region is greater than about two times the net charge density in a JFET region of the MOSFET device.

27. The MOSFET device of claim 26, wherein $\Delta$ an average rate of change in dopant concentration with well depth, in a region from a well depth of $W_B$ to a depth of $2W_B$, is given by $$\Delta = \frac{1}{W_B^2} \int_{W_B}^{2W_B} (N_A - N_D)(x) dx < X,$$

wherein X=6 decades/μm.

28. The MOSFET device of claim 26, wherein the MOSFET device exhibits a blocking voltage in a range from about 600 to about 2000 volts.

29. The MOSFET device of claim 26, wherein the MOSFET device exhibits a threshold voltage in a range from about 3 volts to about 10 volts.

30. The MOSFET device of claim 29, wherein the MOSFET device has a threshold voltage in a range from about 4 volts to about 7 volts.

31. The MOSFET device of claim 26, wherein the MOSFET device exhibits a specific on-resistance in a range from about 1 mOhm cm$^2$ to about 200 mOhm cm$^2$.

32. The MOSFET device of claim 26, wherein the MOSFET is a silicon carbide MOSFET, wherein the semiconductor device layer is a silicon carbide layer.

33. The MOSFET device of claim 26, wherein the MOSFET is a gallium nitride MOSFET, and wherein the semiconductor device layer is a gallium nitride layer.

* * * * *

UNITED STATES PATENT AND TRADEMARK OFFICE
CERTIFICATE OF CORRECTION

| | | |
|---|---|---|
| PATENT NO. | : 7,829,402 B2 | Page 1 of 1 |
| APPLICATION NO. | : 12/368498 | |
| DATED | : November 9, 2010 | |
| INVENTOR(S) | : Matocha et al. | |

It is certified that error appears in the above-identified patent and that said Letters Patent is hereby corrected as shown below:

In Fig. 13, Sheet 9 of 9, delete "Voltgae" and insert -- Voltage --, therefor.

In Column 8, Line 28, delete "mohms-cm$^5$." and insert -- mOhms-cm$^2$. --, therefor.

In Column 8, Line 38, delete "mohms-cm$^5$." and insert -- mOhms-cm$^2$. --, therefor.

In Column 8, Line 41, delete "mohms-cm$^5$." and insert -- mOhms-cm$^2$. --, therefor.

In Column 8, Line 49, delete "invetion" and insert -- invention --, therefor.

In Column 9, Line 13, in Claim 6, delete "wherein Δ" and insert -- wherein Δ, --, therefor.

In Column 10, Line 18, in Claim 22, delete "wherein Δ" and insert -- wherein Δ, --, therefor.

In Column 10, Line 55, in Claim 27, delete "wherein Δ" and insert -- wherein Δ, --, therefor.

Signed and Sealed this
Eighteenth Day of January, 2011

David J. Kappos
*Director of the United States Patent and Trademark Office*